(12) United States Patent
Ōsawa et al.

(10) Patent No.: US 6,286,121 B1
(45) Date of Patent: Sep. 4, 2001

(54) SEMICONDUCTOR DEVICE

(75) Inventors: Tokuya Ōsawa; Hideshi Maeno, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/177,115

(22) Filed: Oct. 22, 1998

(30) Foreign Application Priority Data

Jun. 11, 1998 (JP) .................................................. 10-163439

(51) Int. Cl.[7] .................................................. G01R 31/28
(52) U.S. Cl. .................................................. 714/738
(58) Field of Search .................................. 714/726, 727, 714/729, 738; 326/16

(56) References Cited

U.S. PATENT DOCUMENTS

| | | | |
|---|---|---|---|
| 4,513,418 | 4/1985 | Bardell, Jr. et al. | |
| 5,574,733 | * 11/1996 | Kim | 714/738 |
| 5,724,367 | * 3/1998 | Osawa et al. | 714/720 |
| 5,905,737 | * 5/1999 | Osawa et al. | 714/726 |
| 6,047,394 | * 4/2000 | Matsuzawa | 714/729 |

FOREIGN PATENT DOCUMENTS

P09-5403    1/1997    (JP) .

* cited by examiner

*Primary Examiner*—Albert Decady
*Assistant Examiner*—Shelly A Chase
(74) *Attorney, Agent, or Firm*—Burns, Doane, Swecker & Mathis, LLP

(57) ABSTRACT

When the RAM (10) is not initialized, data signals captured from the data output portions (do[n]) may include undefined value, but these data signals are not transferred to an MISR through the scan path (22). Transferred to the MISR are only the data signals (DI[n]) captured by the scan path (13). Accordingly, BIST can be applied to the combinational logic circuit (40) without requiring initialization of the RAM (10) and without being affected by undefined value. Thus, BIST to the combinational logic circuit (40) can be normally achieved in a short period.

10 Claims, 12 Drawing Sheets

SEMICONDUCTOR DEVICE

BACKGROUND OF THE INVENTION

1. Field of the Invention

The present invention relates to a semiconductor device having a logic unit, a storage unit, and a built-in self test (BIST) circuit, and particularly to improvement for preventing test by the BIST circuit from being interfered with by initial undefined value stored in the storage unit with simple structure.

2. Description of the Background Art

FIG. 10 is a block diagram showing the structure of a conventional semiconductor device as a background of the present invention. This semiconductor device 151 is constructed as a dedicated LSI for specific applications called ASIC (Application-Specific IC), which includes a RAM 10 as a storage unit and combinational logic circuits 40, 41, and 42 as logic units at the same time. It further includes a BIST circuit for executing BIST so as to easily and efficiently perform test to the ASIC formed as a VLSI with highly integrated circuit elements. The BIST is a method for facilitating test to semiconductor devices in which semiconductor devices are tested by themselves.

The BIST circuit has an LFSR (Linear Feedback Shift Register) 50 and an MISR (Multiple Input Signature Register) 51, and it also uses the scan test method. That is to say, storage elements such as flip-flops provided in peripheral parts of the RAM 10 and the combinational logic circuits 40, 41, 42 to achieve original functions of the device 151 (functions other than testing) are coupled in cascade in a freely coupled/decoupled manner to form scan paths 11 to 14, and 21 to 24.

The scan path 23 is located in the peripheral part of the combinational logic circuit 40. It is formed by coupling storage elements that exchange signals with the combinational logic circuit 40. Similarly, the scan path 24 is located in the peripheral part of the combinational logic circuits 41 and 42, which is formed by coupling storage elements that exchange signals with them.

The scan path 21 is formed by coupling storage elements interposed between the combinational logic circuit 40 and the combinational logic circuit 41 for exchanging signals, and the scan path 22 is formed by coupling storage elements interposed between the combinational logic circuit 40 and the combinational logic circuit 42 for exchanging signals. The scan paths 11 to 14 are each formed by coupling storage elements interposed between the RAM 10 and the combinational logic circuit 40 for exchanging signals between them.

These storage elements are coupled to each other only when test is performed, and they are decoupled in other operations. The BIST circuit performs test to the RAM 10 and the combinational logic circuits 40, 41, 42 in the device 151 through these scan paths 11 to 14, 21 to 24. The scan paths 21, 11 to 14, 22 are coupled to form one row of scan path. Three rows of scan paths, the scan path 23, the scan path 21, 11 to 14, 22, and the scan path 24, are interposed between the LFSR 50 and the MISR 51.

Usually, the storage elements like the FFs (flip-flops) forming the scan paths are elements provided in peripheral parts in logic units and storage units, to function as relay for exchange of signals with other units. That is, the storage elements forming the scan paths usually belong to some one of the units. For example, the part surrounded by the dotted line marked "1" in FIG. 10 corresponds to the original storage unit. However, for the purpose of clearly showing the relation between the scan paths and other parts, this specification defines the parts other than the scan paths as the combinational logic circuits (logic units) 40, 41, 42, and RAM (storage unit) 10, as shown in the drawings including FIG. 10.

FIG. 11 is a block diagram showing the inside structure of the LFSR 50. The LFSR 50 includes a plurality of FFs 61 coupled in cascade to each other and an EXOR (exclusive OR element) 62 for connecting them in a circulating manner. The FFs 61 hold and output input signals in synchronization with a clock signal (not shown). Accordingly after the FFs 61 have been supplied with given initial value for initialization, pseudo-random numbers with circulating period determined by the number of FFs 61 coupled in cascade sequentially appear at the outputs of the FFs 61 in synchronization with the clock signal and transferred to the following FFs 61.

In the example shown in FIG. 11, 22 FFs 61 are coupled in cascade and therefore $2^{22}-1$ pseudo-random numbers are periodically generated. Three of the 22 outputs are respectively supplied to the three rows of scan paths. That is, the LFSR 50 is configured as a kind of test pattern generator (TPG) circuit for generating test patterns for BIST and supplying them to a row or a plurality of rows of scan paths.

FIG. 12 is a block diagram showing the internal structure of the MISR 51. The MISR 51 has a plurality of circuits coupled in cascade each including an FF 63 and an EXOR 64, and an EXOR 65 for coupling those circuits in a circulating manner. Signals inputted to the EXORs 64 in synchronization with a clock signal not shown are subjected to certain operation, and then the operated signals are outputted from the final-stage FF 63 as signature SO. The signature SO corresponds to a signal obtained by compacting the signals inputted to one or a plurality of EXORs 64 along time series and (in the case of multiple inputs) along the space.

In the example shown in FIG. 12, 22 circuits are coupled in cascade, and signals from the three rows of scan paths are supplied to three of the 22 inputs. Then the information about the results obtained by testing the individual parts in the device 151 supplied through the scan paths is integrated into the signature SO. Thus, the MISR 51 is configured as a kind of output data compactor (ODC) circuit for compacting signals containing information about test results supplied from a row or a plurality of rows of scan paths, i.e., signals representing test results.

The signature SO is transferred out of the device 151 through a pin (not shown) to be used as expected value for the test results. A comparison in pattern is made between the normal value for the signature SO obtained by performing logical simulation to the device 151 and the real value of the signature SO held in the MISR 51 to determine whether the combinational logic circuits 40, 41, 42 and the RAM 10, including the scan paths, are normal. In this way, the presence of the BIST circuit enables individual parts in the device 151 to be tested just by comparing the value of signature SO outputted from the device 151 itself with the normal value.

FIG. 13 is a block diagram fully showing the scan paths 13 and 14 interposed between the combinational logic circuit 40 and the RAM 10. The scan path 13 is formed by coupling three FFs 71 in cascade which are interposed between the combinational logic circuit 40 and the RAM 10, for receiving signal outputs from the combinational logic circuit 40 and sending them as data signals to data input portions di[n] (n=0, 1, 2) of the RAM 10.

The FFs 71 are coupled with the respective preceding FFs 71 through selectors 72. An SFF (scan flip-flop, generally "a scan storage element") 2 is usually configured by adding a selector 72 required for test to an FF 71 used to allow the device 151 to achieve its original (i.e., designed) function. A plurality of SFFs 2 are coupled in cascade to form the scan path 13. This structure is the same with other scan paths. The FFs 71 in the SFFs 2 forming the scan path 14 receive data signals (storage data signals) outputted from the data output portions do[n] of the RAM 10 and send them to the combinational logic circuit 40.

Each selector 72 is responsive to the value of a scan mode signal SM inputted as a select signal to select one of its two input signals. Specifically, when the scan mode signal SM is 0, the selectors 72 in the scan path 13 select output signals from the combinational logic circuit 40, and those in the scan path 14 select data signals outputted from the data output portions do[n] of the RAM 10. As a result, the SFFs 2 (and the FFs 71) are decoupled from each other and the FFs 71 perform their original function of receiving/sending signals between the units in synchronization with a clock signal.

When the scan mode signal SM is 1, the selectors 72 in the scan paths 13 and 14 select output signals from the preceding SFFs 2. As a result, the SFFs 2 (and the FFs 71) are coupled in cascade to each other, including the coupling of the scan paths 13 and 14, to send output signals from the preceding SFFs 2 to the following SFFs 2 in synchronization with the clock signal.

In this specification, the number of the SFFs 2 forming a scan path is referred to as the number of stages of the scan path. In the example shown in FIG. 13, the scan paths 13 and 14 are each formed of three SFFs 2. Accordingly, the scan paths 13 and 14 are both referred to as "a scan path with three stages." Referring to FIG. 10 again, the BIST circuit in the device 151 has a control circuit not shown, in addition to the LFSR 50 and MISR 51. The scan mode signal SM is supplied to all scan paths in the device 151 by the control circuit. Except when the device 151 performs a test, "0" is supplied as the scan mode signal SM to allow the device 151 to achieve its original function other than test.

When performing a test, "1" is supplied as the scan mode signal SM, so that pseudo-random numbers outputted from the LFSR 50 are sequentially supplied to the multiple-stage SFFs 2 belonging to the three scan paths. At the same time, the pseudo-random numbers held in the SFFs 2 are also inputted to the units connected to the outputs of the SFFs 2. When the pseudo-random numbers supplied from the LFSR 50 have been delivered to all SFFs 2 in the longest (with the largest number of SFFs 2) scan path among the three rows of scan paths, the scan mode signal SM changes from 1 to 0 only in one clock period. This causes the SFFs 2 belonging to the respective scan paths to capture signals outputted from the individual units.

In the example of the scan paths 13 and 14 shown in FIG. 13, when the scan mode signal SM is 0, the SFFs 2 belonging to the scan path 13 capture output signals from the combinational logic circuit 40 and the SFFs 2 belonging to the scan path 14 capture data signals from the data output portions do[n]. Then the value of the scan mode signal SM returns to 1. As a result, the output signals captured from the respective units are transferred along the scan paths into the MISR 51. Then the MISR 51 outputs, for each clock, the signature SO obtained by applying operation to the output signals from the units coming through the scan paths.

[0021] When all the output signals from the respective units captured into the scan paths have been collected into the MISR 51, new pseudo-random numbers are supplied from the LFSR 50 are held in all of SFFs 2 belonging to the respective scan paths. At this instant, the scan mode signal SM changes from 1 to 0 only for one clock period again.

As described above, for each given period in which pseudo-random numbers from the LFSR 50 are delivered to all SFFs 2 in all scan paths, the scan mode signal SM changes from 1 to 0 only for one clock period. Then the pseudo-random numbers as test pattern are supplied as input signals to the individual units and the output signals provided from the individual units in response to their input signals are collected into the MISR 51 and compacted to the signature SO.

The scan path 14 captures data signals outputted from the data output portions do[n] of the RAM 10. This causes the following problem. When a test is started without initializing memory cells (not shown) in the RAM 10, data signals with undefined value stored in the memory cells will be captured into the scan path 14.

As a result, the undefined value is mixed into the MISR 51, then all obtained as the signature SO will be unpredictable undefined value. If the MISR 51 receives undefined value even only at one of its plurality of inputs or even in one clock period, the influence appears in the signature SO, and in all over the entirety of the following signature SO. Accordingly, it is necessary when testing the device 151 to avoid inclusion of undefined value in any SFF 2 in any scan path and also in any clock period.

No undefined value is mixed into the scan paths from the combinational logic circuits 40, 41, 42, unless they are in a state to be determined as malfunction. However, undefined value may be mixed from the RAM 10 when it is not initialized, even if the RAM 10 is normal (i.e., good). In an ordinary scan test not using the BIST, it is possible to perform a normal test by discarding (masking) data including undefined value. However, in the BIST circuit, as stated above, once undefined value is mixed, the signature SO cannot be correctly obtained any more.

FIG. 14 is a block diagram showing part of a semiconductor device constructed to solve this problem. This device 152 has a RAM-BIST circuit 80. The RAM-BIST circuit 80 is a circuit for applying BIST to the RAM 10, which is disclosed in Japanese Patent Laying-Open No.8-94718, for example. Selectors 81, 82, 83 and 84 are interposed between the scan path 21 and the scan path 11, the scan paths 11 and 12, the scan paths 12 and 13, and the scan paths 13 and 14, respectively.

The selectors 81 to 84 each receive two output signals, an output signal from the preceding scan path and one of the output signals SIW, SIA, SIDI, SIDO from the RAM-BIST circuit 80. The selectors 81 to 84 are responsive to a select signal MEM outputted from the RAM-BIST circuit 80 to select one of their respective two input signals and output it. Each SFF 2 has the internal structure shown in FIG. 15.

An OR element (logic al OR element) 85 is connected to the write enable signal input portion "wec" for inputting a signal instructing write enable to the RAM 10. A signal corresponding to OR of the output signal from the scan path 11 and a write inhibit signal WINH included in the output signals from the RAM-BIST circuit 80 is inputted thereto.

First, the RAM 10 is initialized by the following procedure. The select signal MEM is set as MEM=1 and then the output signals SIW, SIA, SIDI, SIDO from the RAM-BIST circuit 80 are selected by the selectors 81 to 84. The output signal SIW is set as SIW=0 and the write inhibit signal WINH as WINH=0. Then 0 is inputted to the write enable signal input portion wec to enable writing of data signal into the RAM 10.

As the output signal SIA, all address signals are outputted to address all memory cells included in the RAM 10. As a result, all address signals are inputted to the address signal input portions a[n] of the RAM 10. In this period, the output signal SIDI is outputted as SIDI=0, for example. Accordingly, 0 is written into all memory cells as initial value. The RAM 10 is initialized in this way.

After the initialization, the select signal MEM is set as MEM=0. As a result, the selectors 81 to 84 select output signals from the preceding scan paths. That is to say, when the scan mode signal SM=1, the scan paths 21, 11 to 14, and 22 are coupled in this order to form a row of scan path. Further, the write inhibit signal WINH is set as WINH=1. As a result, write into the RAM 10 is inhibited. In this state, the RAM 10 and the combinational logic circuits 40, 41, 42 are tested by the LFSR 50 and the MISR 51. Since all memory cells in the RAM 10 have been initialized, no undefined value will be mixed into the MISR 51.

However, with the conventional device 152, the RAM 10 is initialized and then all units in the device 152 including the RAM 10 are tested, which introduces the problem that BIST to the logic units requires a long test time.

To solve this problem, Japanese Patent Laying-Open No.9-5403 discloses a device in which part of the scan path is branched. In this device, a scan path which may capture undefined value is branched to prevent inclusion of undefined value into the MISR. However, with this device, commercially available CAD tools for design-fortestability cannot be used for logical simulation, rule check, etc., because of the presence of the branched scan path.

SUMMARY OF THE INVENTION

According to a first aspect of the present invention, a semiconductor device comprises: a storage unit; a logic unit which exchanges data signals with the storage unit; a first scan path with m ($\geq 1$) stage(s) for transferring a data signal from the logic unit to the storage unit; a second scan path with n ($\leq m$) stage(s) for transferring a storage data signal from the logical storage unit to the logic unit; a test pattern generating circuit for generating a test pattern and supplying the test pattern to an input end of the first scan path; an output data compacting circuit for outputting a signature which is a signal representing an input signal in a compacted form; and a transfer path for transferring a signal from an output end of the first scan path to the output data compacting circuit without through the second scan path; wherein the second scan path has an input end connected to an output of one of the first to (m−n)th stage(s) of the first scan path.

Preferably, according to a second aspect, the semiconductor device further comprises a first selector interposed in the transfer path, responsive to a control signal inputted from outside, for selecting one of the signal from the output end of the first scan path and a signal from an output end of the second scan path and transferring a selected signal to the output data compacting circuit.

Preferably, according to a third aspect, the semiconductor device further comprises a second selector interposed between the input end of the second scan path and the output of the one of the first to (m−n)th stage(s) of the first scan path, wherein the second selector is responsive to the control signal to select one of a signal from the output of the one of the first to (m−n)th stage (s) and the signal from the output end of the first scan path and output a selected signal to the input end of the second scan path, and wherein when the first selector selects the signal from the output end of the second scan path, the second selector selects the signal from the output end of the first scan path.

Preferably, according to a fourth aspect, the semiconductor device further comprises a signal generating circuit for generating a signal for initializing or testing storage data in the storage unit, and a selecting element responsive to an instruction from the signal generating circuit, for supplying the signal generated by the signal generating circuit to the first scan path in such a manner that the test pattern and the signal generated by the signal generating circuit can be freely switched.

Preferably, according to a fifth aspect, the semiconductor device further comprises a selecting element responsive to the control signal for selecting one of the test pattern generated by the test pattern generating circuit and a test pattern supplied from outside and supplying a selected test pattern to the input end of the first scan path, and a pin capable of taking outside a signal inputted to the output data compacting circuit, wherein when the first selector selects the signal from the output end of the second scan path, the selecting element selects the test pattern supplied from outside.

Preferably, according to a sixth aspect, the semiconductor device further comprises third to Kth (K$\geq$3) scan path(s), wherein the second to Kth scan paths each have n stage(s) comprising n storage element(s) for relaying the storage data signal with n bit(s) transferred from the storage unit to the logic unit, and the second to Kth scan paths have their respective input ends connected in common to the output of the one of the first to (m−n)th stage(s) of the first scan path Preferably, according to a seventh aspect, the semiconductor device further comprises a first selector responsive to a control signal inputted from outside, for selecting one of the signal from the output end of the first scan pa th and a signal from an output end of the Kth unit scan path and transferring a selected signal to the output data compacting circuit, and second to Kth selectors respectively interposed between input ends of the second to Kth unit scan paths and the output of the one of the first to (m−n)th stage(s) of the first scan path, wherein the second selector is responsive to the control signal to select one of a signal from the output of the one of the first to (m−n)th stage(s) and the signal from the output end of the first scan path and output a selected signal to the input end of the second scan path, and for all of j(s) in the range of 3$\leq$j$\leq$K, the jth selector is responsive to the control signal to select one of the signal from the output of the one of the first to (m−n)th stage(s) and a signal from an output end of the (j−1)th unit scan path and output a selected signal to the input end of the jth scan path, and wherein when the first selector selects the signal from the output end of the Kth scan path, the second selector selects the signal from the output end of the first scan path and the jth selector selects the signal from the output end of the (j−1)th scan path.

According to the device of the first aspect, the second scan path is connected with the first scan path as if it is branched from part of the first scan path. Further, there exists a transfer path for transferring a signal from the output end of the first scan path to the output data compacting circuit without through the second scan path. Hence it is possible to execute BIST to the logic unit without influence of undefined value stored in the storage unit. Further, since the test pattern held in the second scan path is the same as the test pattern held in part of the first scan path, it is equivalent to a structure in which the test pattern is inputted to the logic unit directly from the part of the first scan path. Therefore, commercially available CAD tools for design-for-testability can be used without any problem in logical simulation and the like. At the same time, the BIST is made through scan paths with a smaller number of stages and the storage unit is not initialized, which also reduces the test time.

According to the device of the second aspect, with the presence of the first selector, not only the signal from the output end of the first scan path but also the signal from the output end of the second scan path can be selectively transferred to the output data compacting circuit. This enables test to the storage unit.

According to the device of the third aspect, with the presence of the second selector, the first and second scan paths can be selectively cascade-connected. Accordingly the scan paths themselves can be tested efficiently.

According to the device of the fourth aspect, with the presence of the signal generating circuit, signal for initializing or testing the storage data in the storage unit can be selectively inputted to the storage unit through the first scan path. Accordingly BIST can be applied to the storage unit after initializing the storage unit.

According to the device of the fifth aspect, test pattern can be inputted from outside and a signal inputted to the output data compacting circuit can be taken outside. This enables scan test to the storage unit.

According to the device of the sixth aspect, the second scan path is expanded to a plurality of (K-1) scan paths which equally function, which enables application to a storage unit having multiple-port data output portions.

According to the device of the seventh aspect, with the presence of the K selectors, not only the signal from the output end of the first scan path but also the signal from the output end of the row of scan path formed of the first to Kth scan paths connected in cascade in this order can be selectively transferred to the output data compacting circuit. This enables test to the storage unit. Further, the first to Kth san paths can be tested efficiently.

Thus, an object of the present invention is to provide a semiconductor device capable of performing BIST to the logic unit without initialization of the storage unit and also capable of allowing the use of commercial CAD tools for design-for-testability without any problem.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
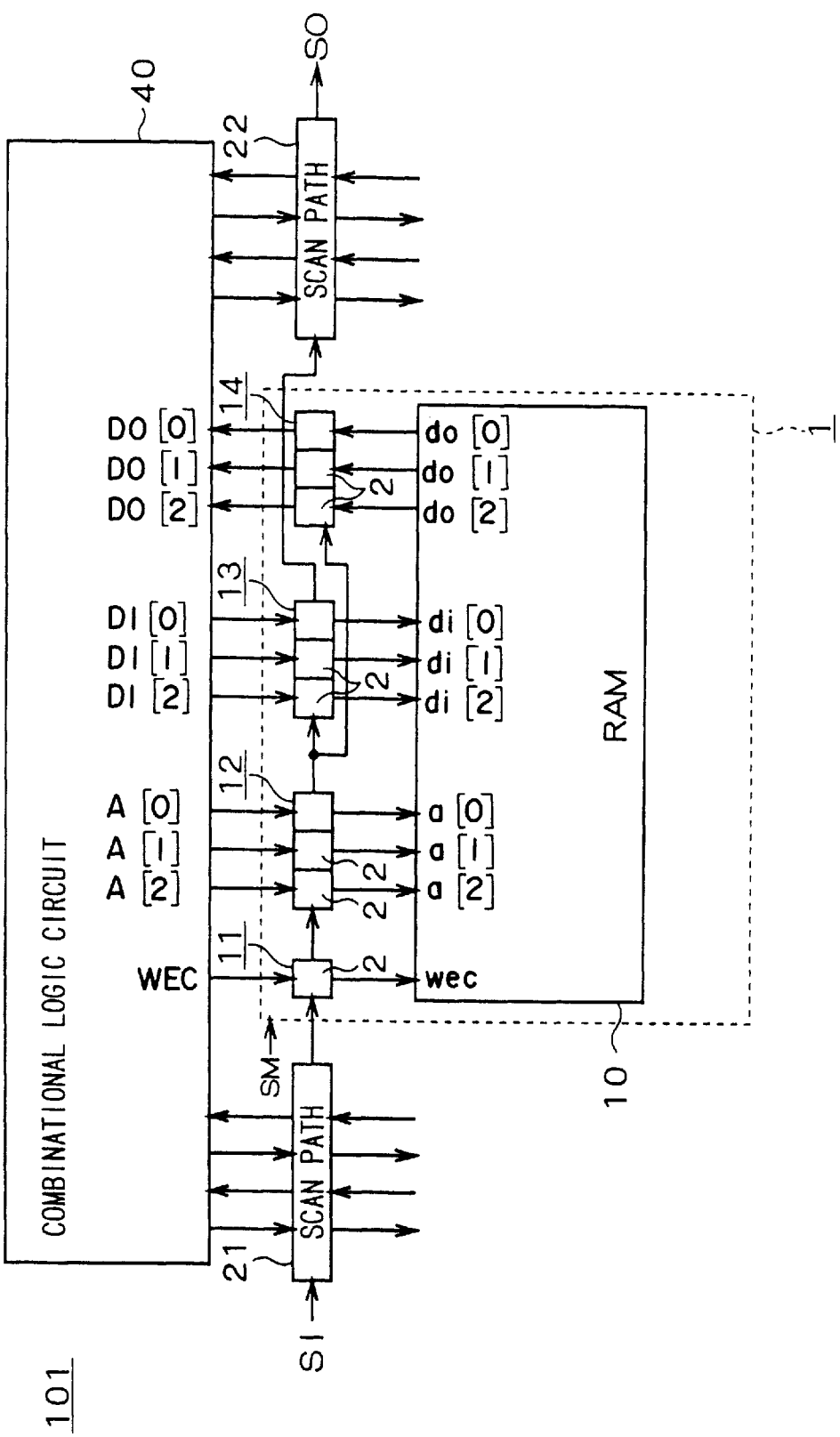
FIG. 1 is a block diagram showing a device according to a first preferred embodiment.
Figure 10:
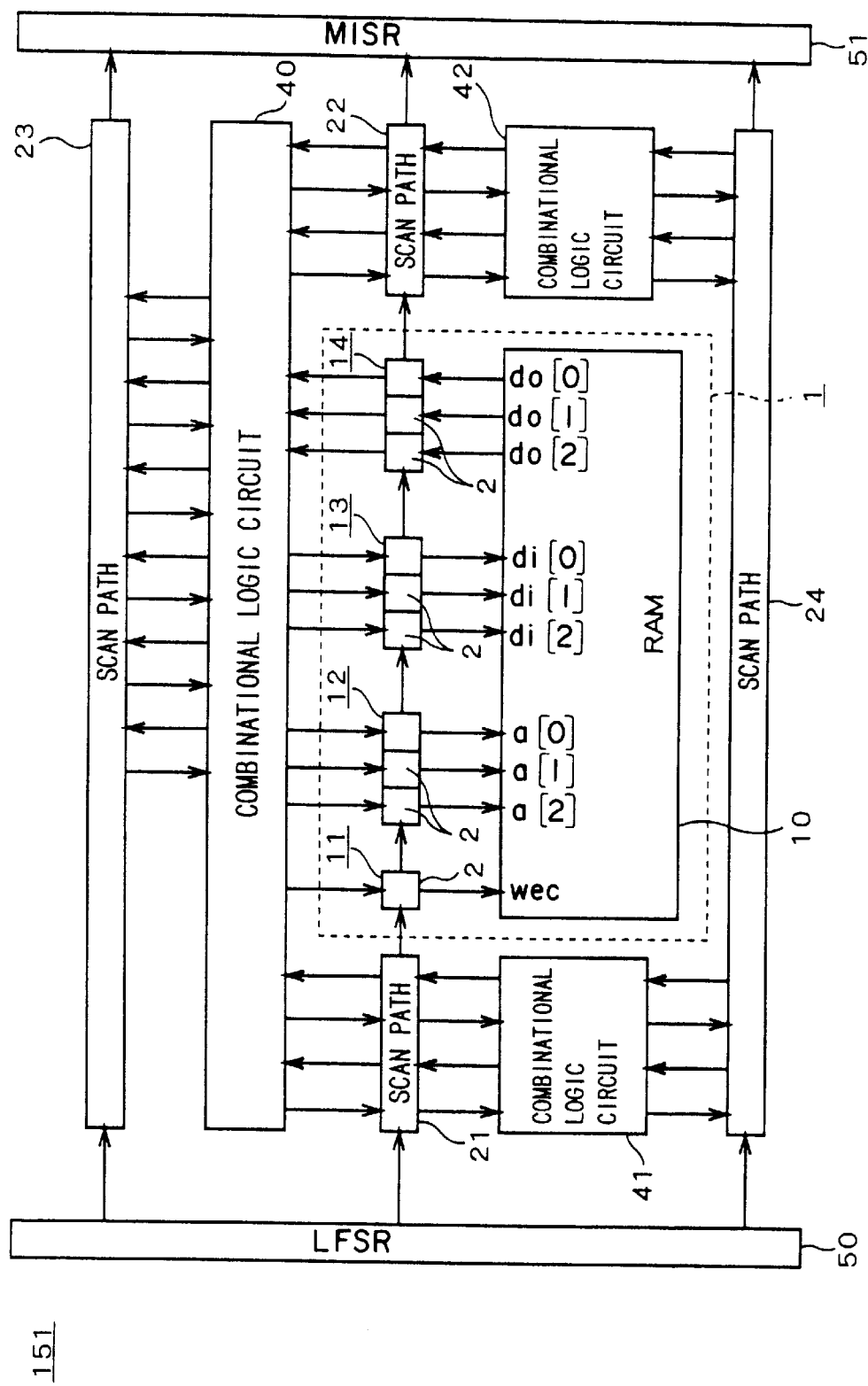
FIG. 10 is a block diagram showing a conventional device.
Figure 11:
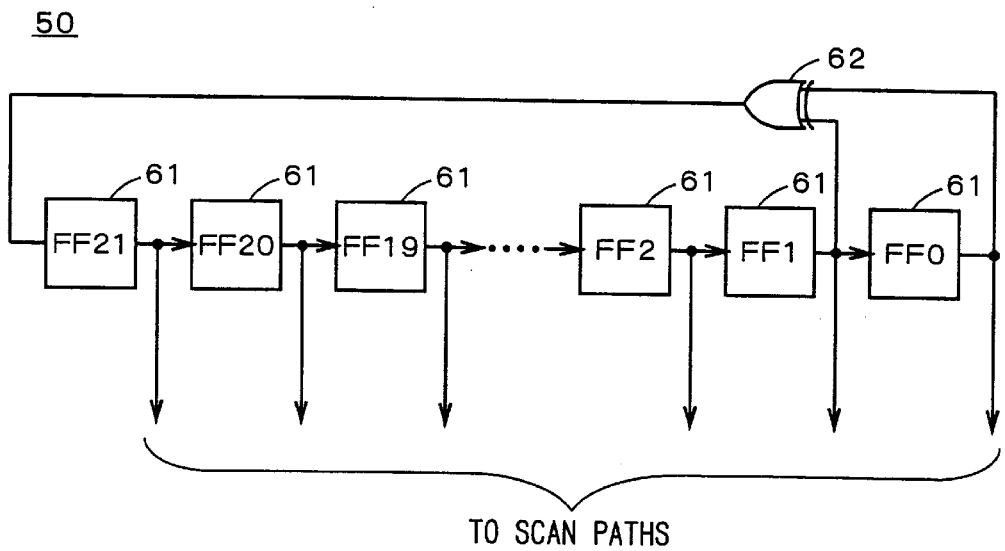
FIG. 11 is an internal block diagram showing LFSR.
Figure 12:
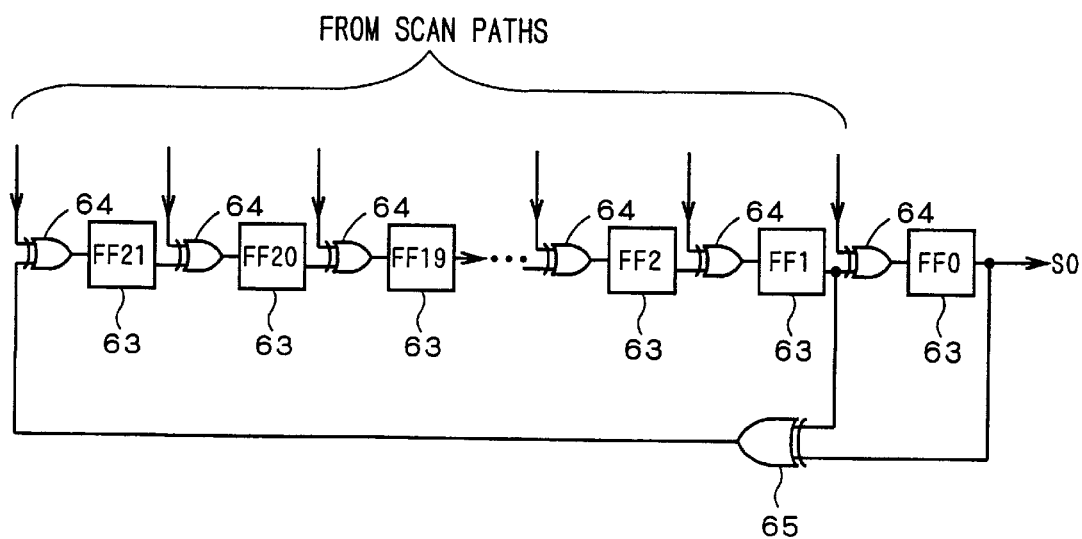
FIG. 12 is an internal block diagram showing MISR.
Figure 15:
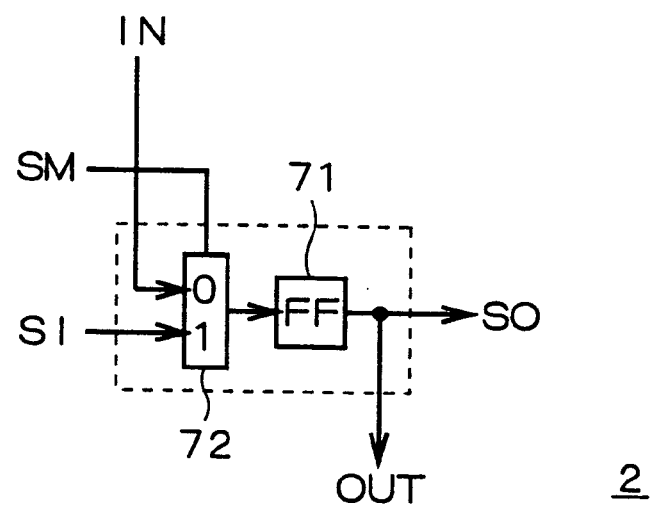
FIG. 15 is an internal block diagram of SFF.

FIG. 1 is a block diagram showing the structure of a storage unit and its vicinity in a semiconductor device according to a first preferred embodiment. Although this semiconductor device 101 also has the LFSR 50, MISR 51, the combinational logic circuits 41, 42, and the like, they are not shown in this diagram because they are configured in the same way as those in the device 151 shown in FIG. 10 The SFFs 2 forming the respective scan paths have the internal structure shown in FIG. 15.

Similarly to those in the conventional device 151, the scan paths 11, 12, and 13 receive the write enable signal WEC, address signals A[n], and data signals DI[n] from the combinational logic circuit 40. Further, the data signals DO[n] are inputted from the scan path 14 to the combinational logic circuit 40. The device 101 is characteristically different from the device 151 in that the input end of the scan path 13 and the input end of the scan path 14 are connected to the output end of the scan path 12 in common.

When the scan mode signal SM is 1, the scan path 13 provides test pattern to the data input portions di[n] and the scan path 14 provides the same test pattern to the combinational logic circuit 40 as the data signals DO[n]. When the scan mode signal SM is 0, the scan path 13 captures the data signals DI[n] from the combinational logic circuit 40 and the scan path 14 captures the data signals from the data output portions do[n] of the RAM 10.

Figure 13:
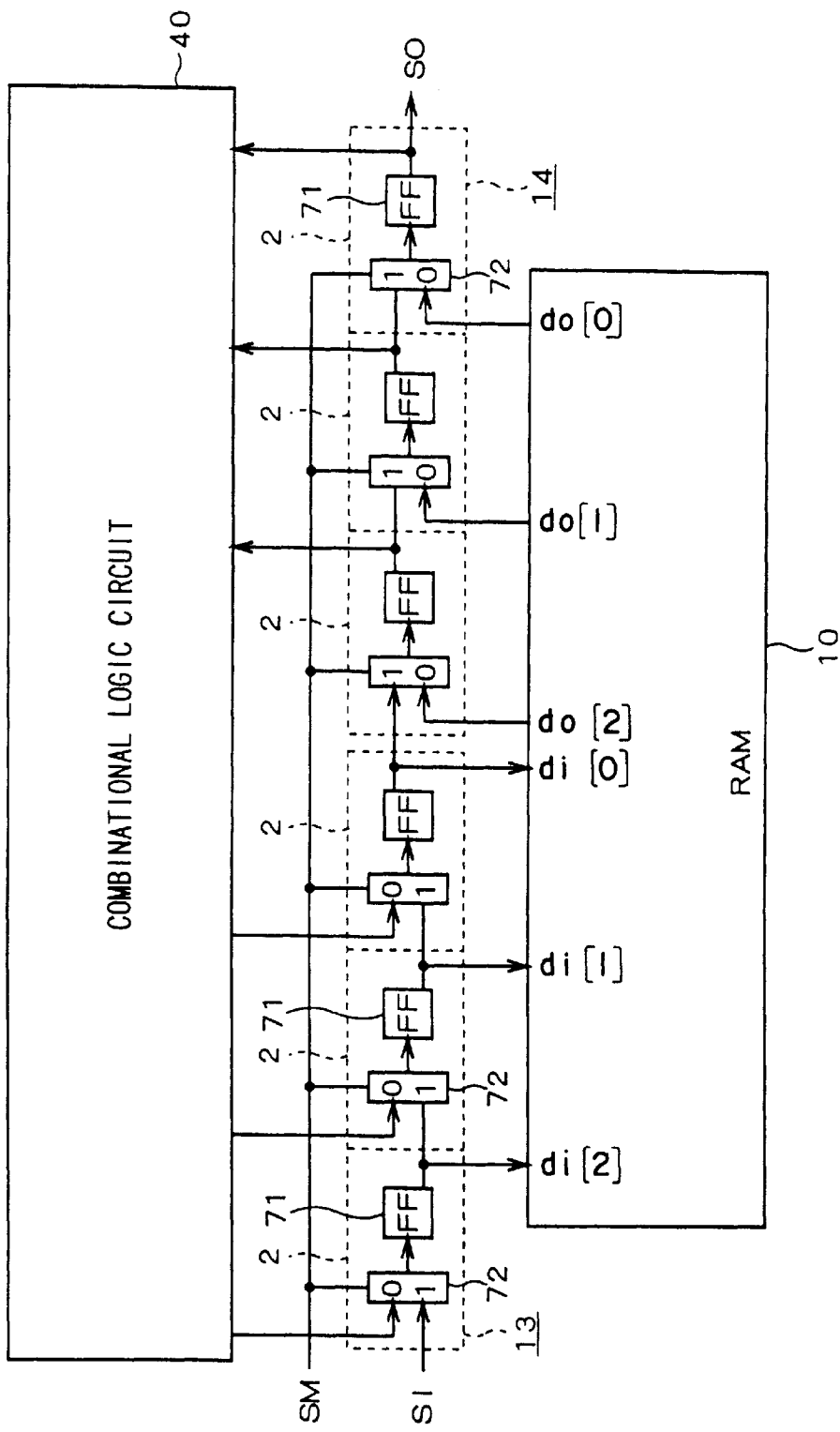
FIG. 13 is a block diagram fully illustrating part of the conventional device.
Figure 14:
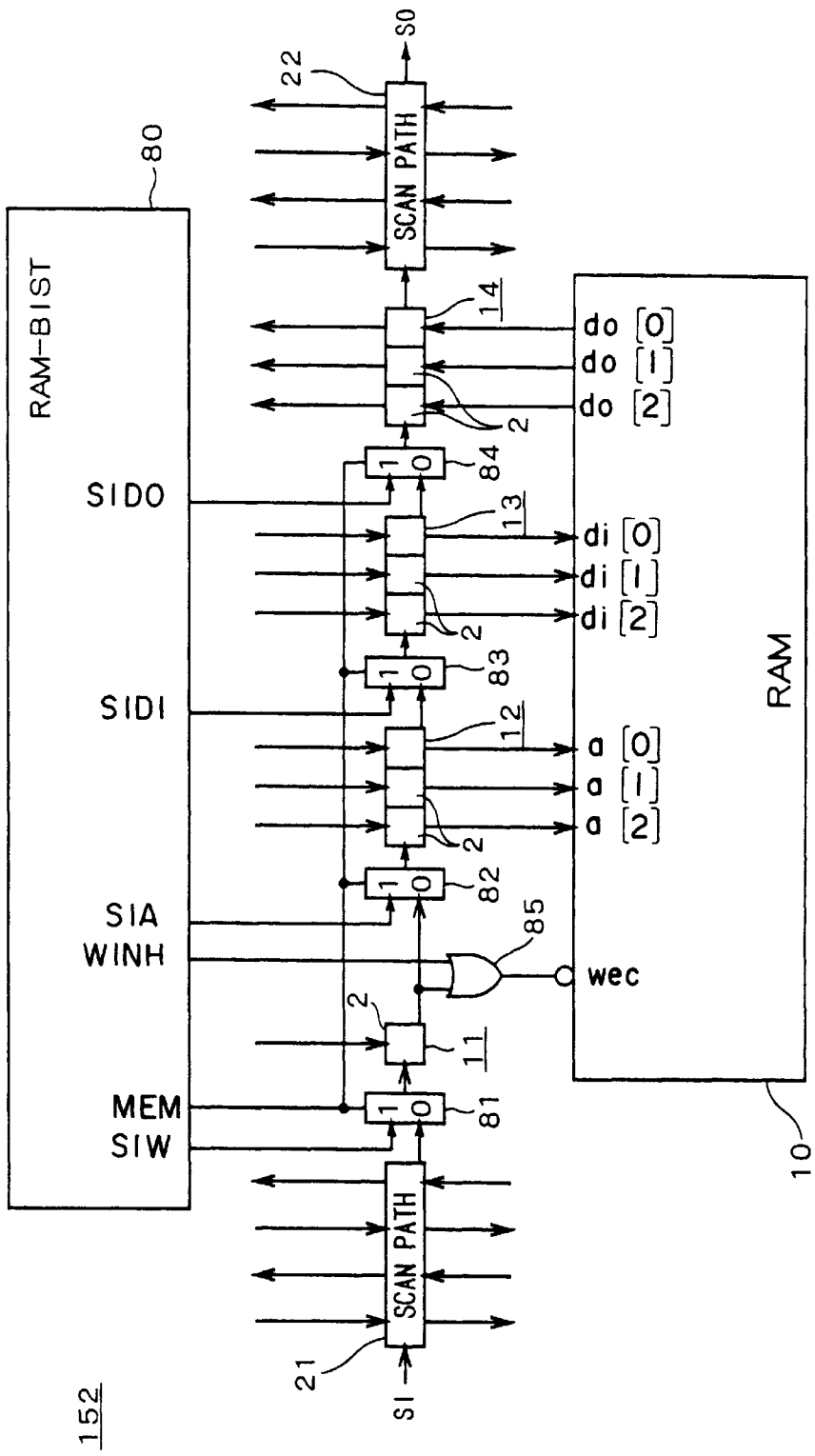
FIG. 14 is a block diagram showing another conventional device.

The data signals captured from the data output portions do[n] may include undefined value, but these data signals are not transferred to the MISR 51 (FIG. 10) through the scan path 22. Only the data signals DI[n] captured into the scan path 13 are transferred to the MISR 51. Accordingly it is possible to normally apply BIST (logic BIST) to the combinational logic circuits 40, 41, 42 (FIG. 13) without being affected by the undefined value.

The scan path 22 is not coupled with the scan path 14. It serves as a transfer path for transferring signals held in the scan path 13 to the MISR 51. When no signal is exchanged between the combinational logic circuit 42 (FIG. 10) and the combinational logic circuit 40 and therefore the scan path 22 is not formed, the output end of the scan path 13 is directly connected to the MISR 51. In this case, a mere signal line or connection corresponds to the above-mentioned transfer path.

Moreover, since it is not necessary to initialize the RAM 10 in the device 101, the period required for logic BIST can be shortened and the circuit scale required for the logic BIST can be reduced as compared with that in the device 152. Although the same test pattern is set in the scan paths 13 and 14, the failure detection rate is not affected because the RAM 10 is not tested in the logic BIST.

Figure 2:
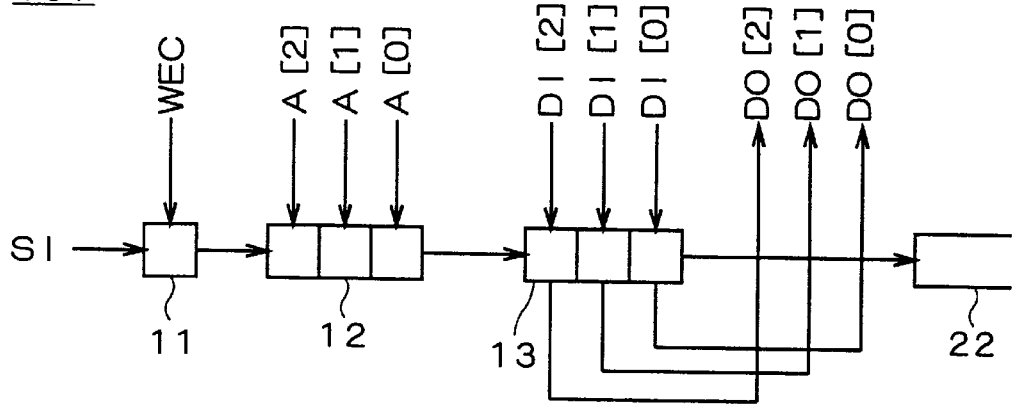
FIG. 2 is an equivalent block diagram showing the device of the first preferred embodiment.

Further, since the scan path 13 and the scan path 14 are not in a cascade relation but in a parallel relation and are connected to the scan path 12 in common, the scan paths 11 to 14 can be represented equivalently as shown in FIG. 2 for the combinational logic circuit 40. That is to say, the scan paths 11 to 14 can be represented as equivalent to the scan paths 11 to 13 which are not branched.

For BIST, the use of CAD tools for design-for-testability is essential to perform simulation for obtaining scan conversion, failure detection rate, signature SO from the MISR, or to perform rule check, for example. Usually, those CAD tools for design-for-testability that are available on the market cannot be applied to branched scan paths. In the device 101, as shown in FIG. 2, the scan paths 11 to 14 can be equivalently expressed as the scan paths 11 to 13 which are not branched. Accordingly using the circuit of FIG. 2 as an object of the simulations and the like in place of the circuit of FIG. 1 enables the use of commercially available CAD tools for design-for-testability. In addition, since the scan paths 13 and 14 are shortened into the scan path 13 in an equivalent manner and the RAM is not initialized, the time required for test can be shortened also in these respects.

<Second Preferred Embodiment>

Figure 3:
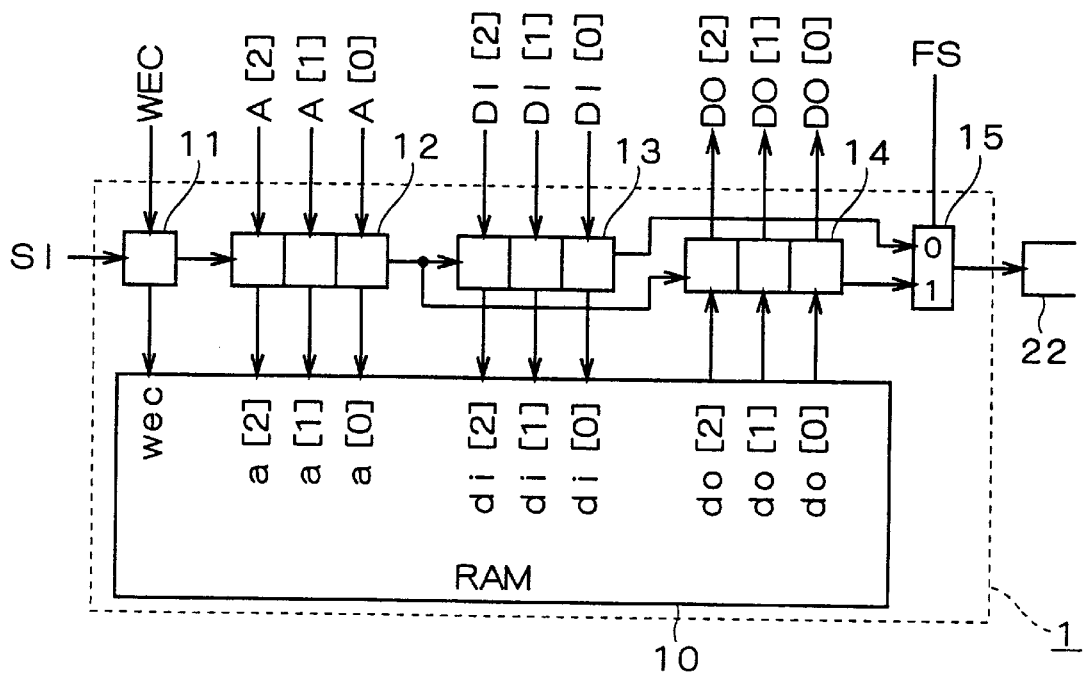
FIG. 3 is a block diagram showing a device according to a second preferred embodiment.

FIG. 3 is a block diagram showing the structure of a RAM and its vicinity in a semiconductor device according to a second preferred embodiment. This device 102 is characteristically different from the device 101 in that a selector 15 is connected to the input end of the scan path 22, with the output ends of the scan paths 13 and 14 connected to two inputs of the selector 15. The selector 15 selects one of the scan paths 13 and 14 in response to a full scan signal FS as a control signal inputted through a pin (not shown) from outside and transfers the output signal to the scan path 22 of the following stage.

When the full scan signal FS is 0, the selector 15 selects the output signal from the scan path 13 and transfers it to the scan path 22. In this situation, the device 102 is equivalent to the device 101 and the scan paths 11 to 14 can be equivalently represented as the scan paths 11 to 13 of FIG. 2 for the combinational logic circuit 40. Accordingly, it is possible to remove the influence of undefined value from the RAM 10 and to execute logic BIST in a short period. It is also possible to use the commercial CAD tools for design-for-testability.

When the full scan signal FS is 1, the selector 15 selects the output signal from the scan path 14 and transfers it to the scan path 22. Then the data signals outputted from the data output portions do[n] of the RAM 10 can be captured into the scan path 14 and transferred to the following scan path 22. Accordingly it is possible to apply BIST or scan test to the RAM 10. The device 102 is tested in accordance with the following steps (1) to (5).

(1) Logic BIST is executed. During this execution, the full scan signal FS is set at 0. When the scan mode signal SM is 1, test pattern supplied from the LFSR 50 is sequentially transferred through the scan paths.

(2) The scan mode signal SM goes 0 in one clock period. At this time, output signals from the logic units and the RAM 10 are captured into the scan paths.

(3) The scan mode signal SM attains 1 again and then the signals captured into the scan paths in the above step (2) are transferred to the MISR 51 and compacted as the signature SO. In the step (2) above, undefined value may be captured from the RAM 10 into the scan path 14, but the undefined value is not transferred to the MISR 51 since FS=0.

(4) The steps (1) to (3) above are repeated.

(5) After the test pattern has all been generated by the LFSR 50, a comparison about signal pattern is made between the signature SO outputted from the MISR 51 and normal value for the signature SO obtained in advance by simulation, on the basis of which it is determined whether the logic units in the device 102 are normal or not.

(6) The full scan signal FS is set at 1 and the RAM 10 is tested by using the scan paths 11, 12, 14 as scan paths for common scan test, for example. How this test is enabled will be more specifically described in a fifth preferred embodiment later. It is also possible to make BIST on the basis of the signature SO outputted from the MISR 51.

As described above, the device 102 can quickly perform logic BIST without being affected by undefined value stored in the RAM 10, and further, it can test the RAM 10 by using the scan paths 11 to 14. Moreover, similarly to the device 101, it raises no problem in the use of the commercial CAD tools for design-for-testability.

<Third Preferred Embodiment>

Figure 4:
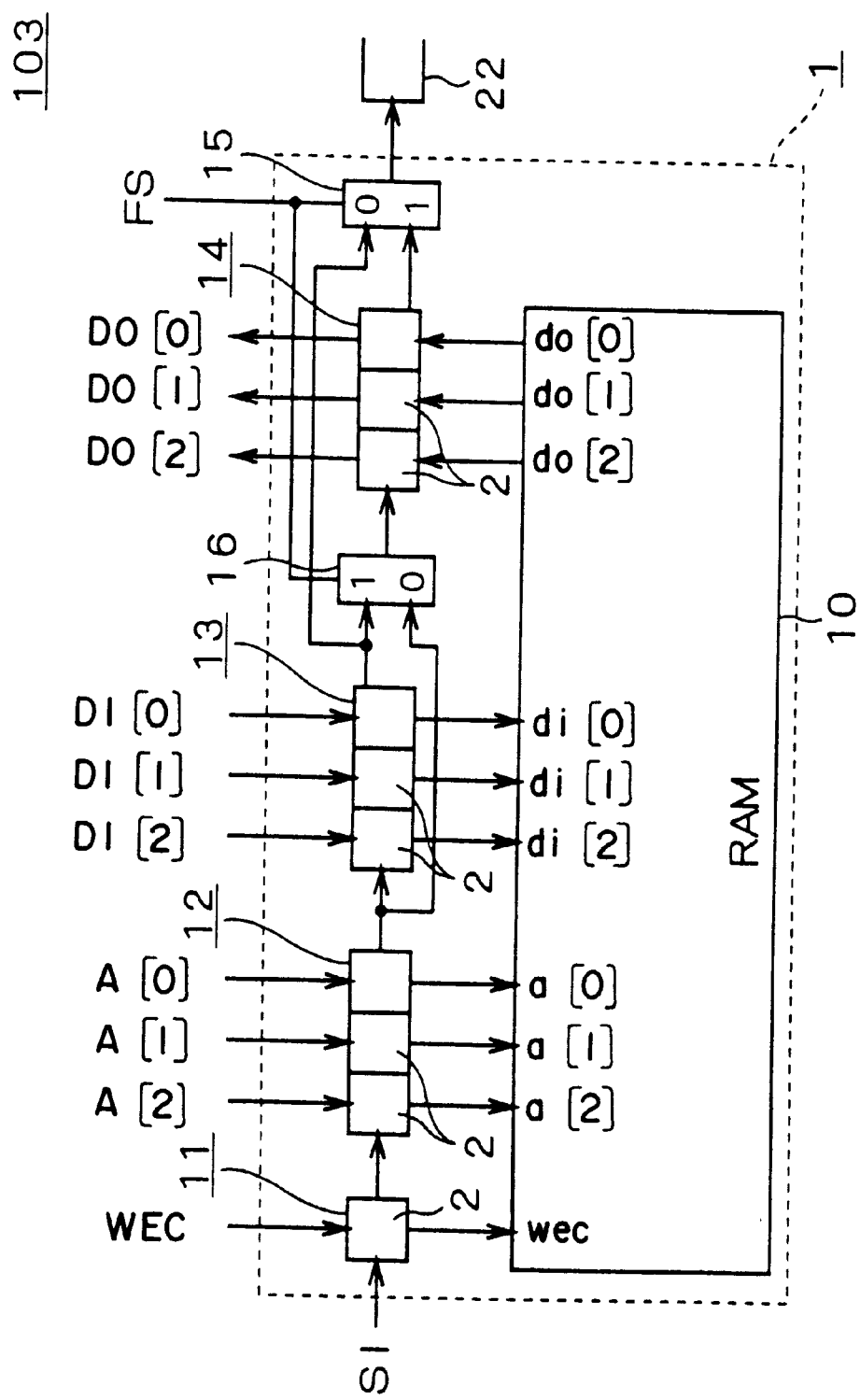
FIG. 4 is a block diagram showing a device according to a third preferred embodiment.

FIG. 4 is a block diagram showing the structure of a RAM and its vicinity in a semiconductor device according to a third preferred embodiment. The device 103 characteristically differs from the device 102 in that a selector 16 is connected to the input end of the scan path 14, and the output ends of the scan paths 12 and 13 are respectively connected to the two inputs of the selector 16. The selector 16 selects one of the scan paths 12 and 13 in response to the full scan signal FS which is inputted also to the selector 15 in common and transfers the output signal to the following scan path 14.

When the full scan signal FS is 0, the selector 15 selects the output signal from the scan path 13 and transfers it to the scan path 22, and at the same time, the selector 16 selects the output signal from the scan path 12 and transfers it to the scan path 14. In this situation, the device 103 is equivalent to the device 101 and the scan paths 11 to 14 can be equivalently represented as the scan paths 11 to 13 of FIG. 2 for the combinational logic circuit 40. Therefore, it is possible to remove the influence of undefined value from the RAM 10 and execute logic BIST in a short period. It is also possible to use CAD tools for design-for-testability.

When the full scan signal FS is 1, the selector 15 selects the output signal from the scan path 14 and transfers it to the scan path 22. At the same time, the selector 16 selects the output signal from the scan path 13 and transfers it to the scan path 14. That is to say, the scan paths 11 to 14 are connected in cascade in this order to form a row of scan path.

Accordingly, data signals outputted from the data output portions do[n] of the RAM 10 are captured into the scan path 14 and transferred to the following scan path 22. This enables BIST or scan test to the RAM 10.

Further, while the scan paths themselves must be tested in advance when testing the RAM 10, the device 103 can achieve it in a single test, since the scan paths 11 to 14 form one scan path when FS=1. In this respect, the device 103 is in contrast with the device 102 in which the scan paths themselves must be tested both for FS=0 and 1.

As described above, with the device 103, it is possible to quickly execute logic BIST while removing the influence of undefined value stored in the RAM 10, and also to execute test to the RAM 10 by using the scan paths 11 to 14. Similarly to the device 101, it does not cause any trouble in the use of commercially available CAD tools for design-for-testability. Further, it can efficiently perform test to the scan paths themselves.

<Fourth Preferred Embodiment>

Figure 5:
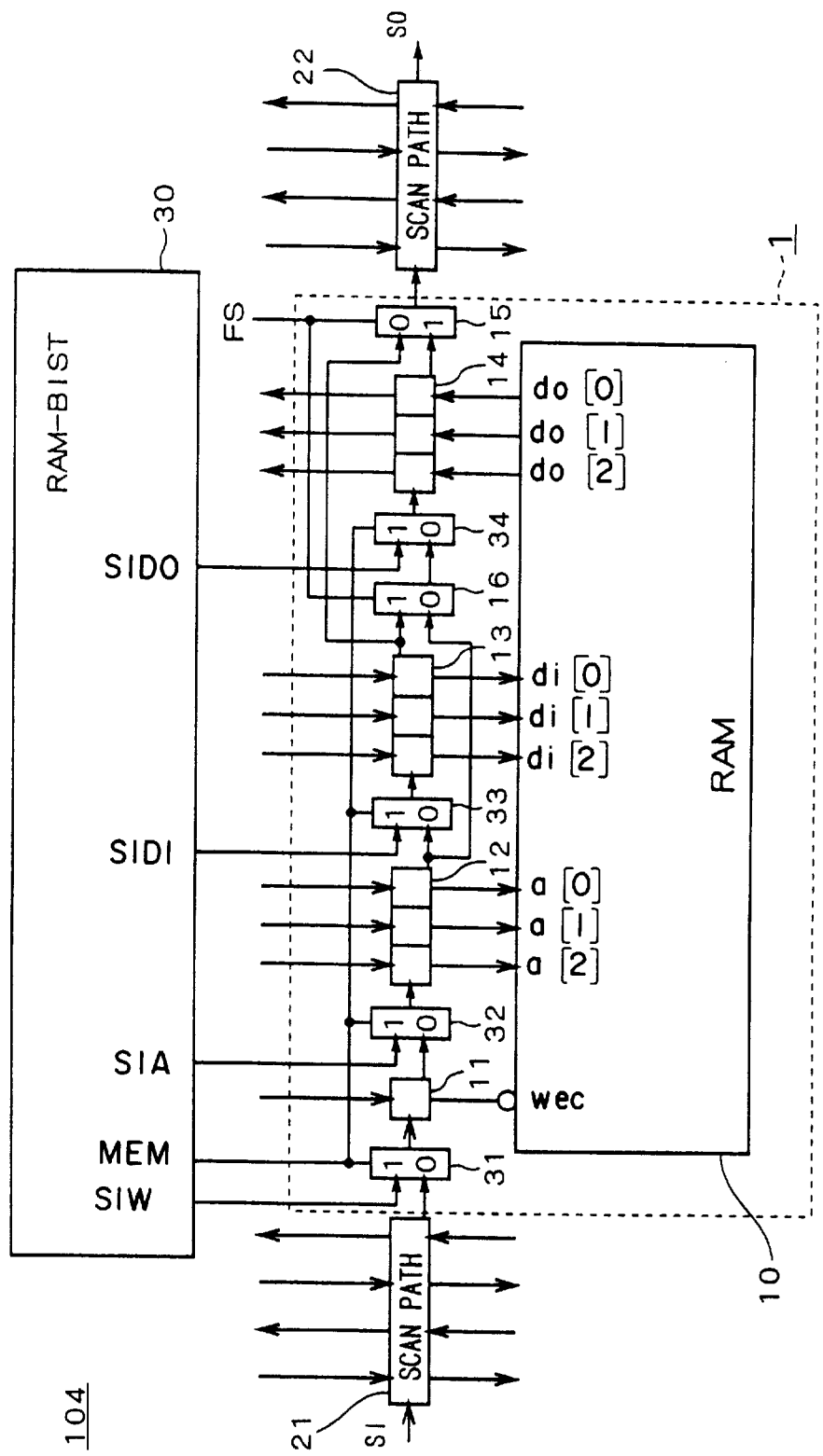
FIG. 5 is a block diagram showing a device according to a fourth preferred embodiment.

FIG. 5 is a block diagram showing the structure of a RAM and its vicinity in a semiconductor device according to a fourth preferred embodiment. In this device 104, selectors 31 to 34 are connected to the input ends of the scan paths 11 to 14, respectively. It further has a RAM-BIST circuit 30, which is connected to the scan paths 11 to 14 through the selectors 31 to 34.

The selectors 31 to 34 each receive two output signals, the output signal from the corresponding scan path of the preceding stage and a corresponding one of the output signals SIW, SIA, SIDI, SIDO from the RAM-BIST circuit 30. The selectors 31 to 34 are responsive to the select signal MEM outputted from the RAM-BIST circuit 30 to select and output one of their respective two input signals.

When logic BIST is performed, the select signal MEM is outputted as MEM=0. During this performance, the scan paths 11 to 14 are equivalent to the scan paths 11 to 14 in the device 103. Accordingly the same effects as those of the third preferred embodiment are obtained. The RAM 10 is tested by the RAM-BIST circuit 30.

As described above, with the device 104, it is possible to remove the influence of undefined value stored in the RAM 10 without initializing memory cells and quickly perform logic BIST, and also to perform test to the RAM 10 by using the RAM-BIST circuit 30 and the scan paths 11 to 14. Further, similarly to the device 101, it has no problem in the use of commercial CAD tools for design-for-testability. Moreover, it provides the advantage of enabling efficient test to the scan paths themselves.

While the device 104 of FIG. 5 corresponds to introduction of the RAM-BIST circuit 30 into the device 103 of the third preferred embodiment, the RAM-BIST circuit 30 may be introduced into the device 102 of FIG. 3 in the same way. Also in this configuration, it is possible to remove the influence of undefined value without initializing memory cells to thereby quickly perform logic BIST, and also to perform test to the RAM 10 by using the RAM-BIST circuit 30 and the scan paths 11 to 14. Further, similarly to the device 101, it causes no problem in the use of commercial CAD tools for design-for-testability.

<Fifth Preferred Embodiment>

Figure 6:
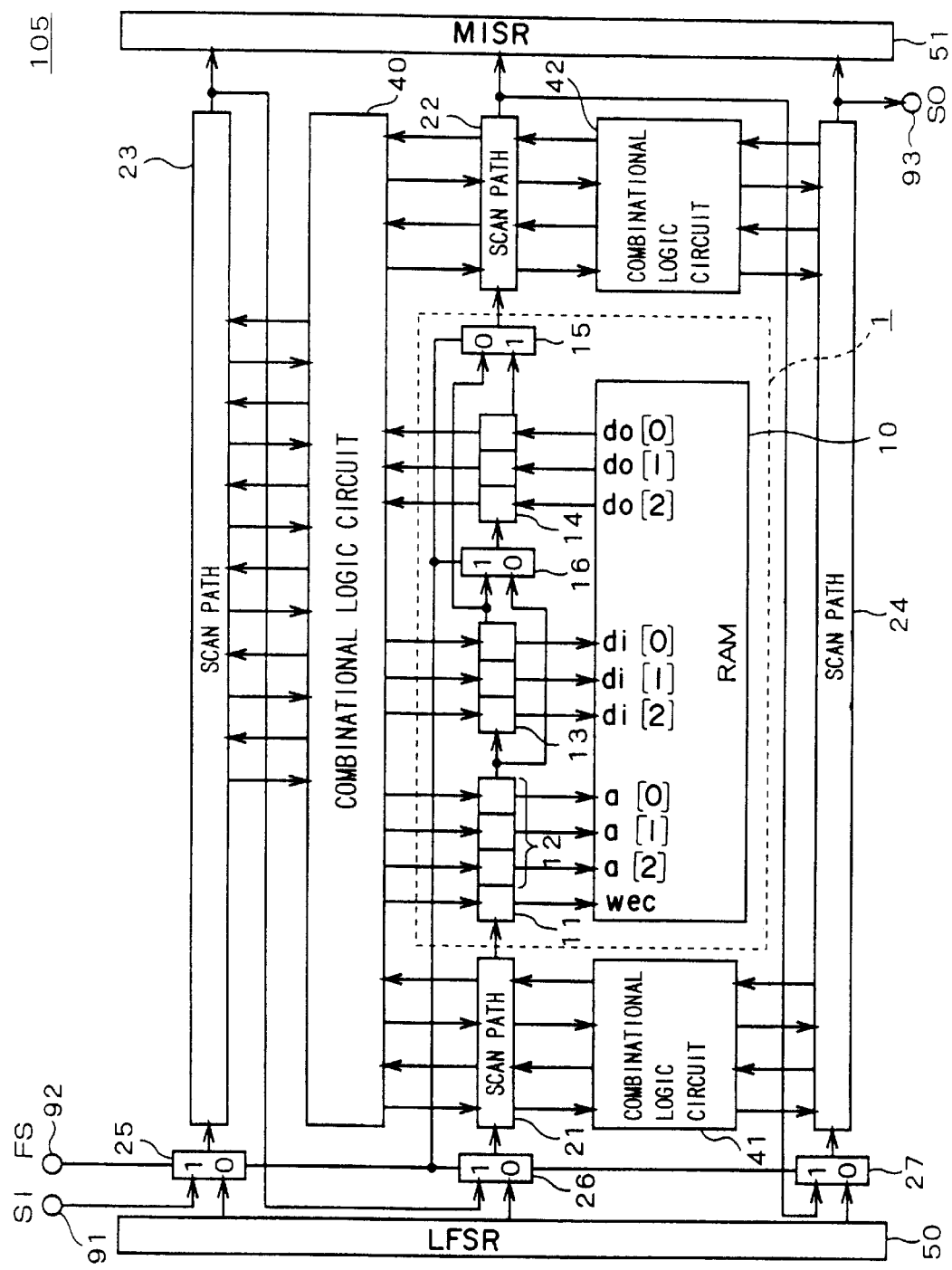
FIG. 6 is a block diagram showing a device according to a fifth preferred embodiment.

FIG. 6 is a block diagram showing the structure of a semiconductor device according to a fifth preferred embodiment. In this device 105, the scan paths 11 to 14 and the RAM 10 are structured the same as those in the device 103 (FIG. 3). In the device 105, selectors 25, 26 and 27 are connected to the input ends of the scan paths 23, 21, and 24, respectively. The selector 25 has two inputs connected to a pin 91 for relaying an externally inputted scan input signal SI and to one of outputs of the LFSR 50. The selector 26 has two inputs connected to the output end of the scan path 23 and to one of the outputs of the LFSR 50, and similarly, the selector 27 has two inputs connected to the output end of the scan path 22 and to one of the outputs of the LFSR 50.

Similarly to the selectors 15 and 16, the selectors 25, 26, and 27 are responsive to the full scan signal FS to select one of their respective two inputs. The full scan signal FS is inputted from the outside through a pin 92. When the full scan signal FS is 0, the selectors 25, 26 and 27 all select the output signals from the LFSR 50 and transfer them to the scan paths 23, 21, and 24, respectively.

When FS=1, the selectors 25, 26 and 27 respectively select the scan input signal SI, the output signal from the scan path 23, and the output signal from the scan path 22, and transfer them to the scan paths 23, 21, and 24, respectively. The output signal from the scan path 24 is not only inputted to the MISR 51 but also outputted as the signature SO to the outside through a pin 93.

When the full scan signal FS is 0, the scan paths 11 to 14 can be represented equivalently as the scan paths 11 to 13 of FIG. 2 for the combinational logic circuit 40. The three output signals from the LFSR 50 are inputted to the scan paths 23, 21, and 24 through the selectors 25, 26 and 27, respectively. That is to say, when FS=0, the device 105 is equivalent to the device 101 through the entirety. Accordingly, it is possible to remove the influence of undefined value in the RAM 10 and perform logic BIST in a short period. It is also possible to use the CAD tools for design-for-testability.

When FS=1, the scan paths 11 to 14 are coupled in a cascade manner in this order to form a single row of scan path. As a result, the data signals outputted from the data output portions do[n] of the RAM 10 can be captured into the scan path 14 and transferred to the following scan path 22. Further, the scan paths 23, 21, 11 to 14, 22, 24 are connected in cascade in this order through the selectors 25, 26, 27, which forms a single row of scan path in the device 105.

The scan input signal SI can be inputted to the input end of the single row of scan path through the pin 91, and the signature SO can be taken out from its output end through another pin 93. As a result, it is possible to apply ordinary scan test to the RAM 10. Since the scan paths 11 to 14 form a single row of scan path when FS=1, it provides the advantage that the scan paths can be tested all together.

The logic BIST and the scan test have their respective advantages and disadvantages. For example, the scan test has disadvantages as: (1) the number of test patterns is large and the expected value is long; (2) it is difficult to perform test in synchronization with a system clock. For example, even if the frequency of the system clock is 100 MHz, the scan test can be made usually at frequencies as low as about 10 MHz. Accordingly, in the respect of operating speed, it is difficult to perform test while reflecting the real operation.

On the other hand, with logic BIST, it is possible to cause the LFSR 50 to operate with a system clock, and then after the test, to take out data compacted in the MISR 51 in synchronization with a test clock. However, since the logic BIST uses pseudo-random numbers as test pattern, its failure detection rate is usually lower as compared with that in the scan test, though it depends on the circulating cycle of the pseudo-random numbers. Further, since test results are compacted in the logic BIST, failure locations cannot be distinguished. Accordingly the logic BIST is not suitable for defect analysis.

Hence, it is preferable to employ suitable tests in proper places. For example, it is preferred that a semiconductor manufacturer should employ both of scan test and logic BIST when it ships products in the form of semiconductor chips, and that a system constructor which incorporates semiconductor chips into boards to construct systems should execute logic BIST when testing the boards as products. The device 105 of this preferred embodiment can satisfy this demand.

As described above, it is possible with the device 105 to remove the influence of undefined value stored in the RAM 10 without initializing memory cells to thereby quickly execute logic BIST, and also to execute scan test to the RAM 10. Further, similarly to the device 101, it has no problem in the use of commercially available CAD tools for design-for-testability. Further, it provides the advantage of enabling efficient test to the scan paths themselves.

While the device 105 of FIG. 6 is configured to enable scan test to the RAM 10 in the device 103 of the third preferred embodiment, it is also possible to similarly incorporate the structure for enabling scan test to the RAM 10 in the device 102 of FIG. 3. Also in this configuration, it is possible to remove the influence of undefined value without initializing memory cells to thereby quickly execute logic BIST and to execute scan test to the RAM 10. Further, similarly to the device 101, it does not cause any trouble in the use of commercial CAD tools for design-for-testability.

<Sixth Preferred Embodiment>

The above-described preferred embodiments have shown examples in which the number of ports of the data input portions di[n] of the RAM 10 and the number of ports of the data output portions do[n] are both one. However, the present invention can be applied also to semiconductor devices in which those portions have different numbers of ports. The following preferred embodiments will describe semiconductor devices constructed in this way.

Figure 7:
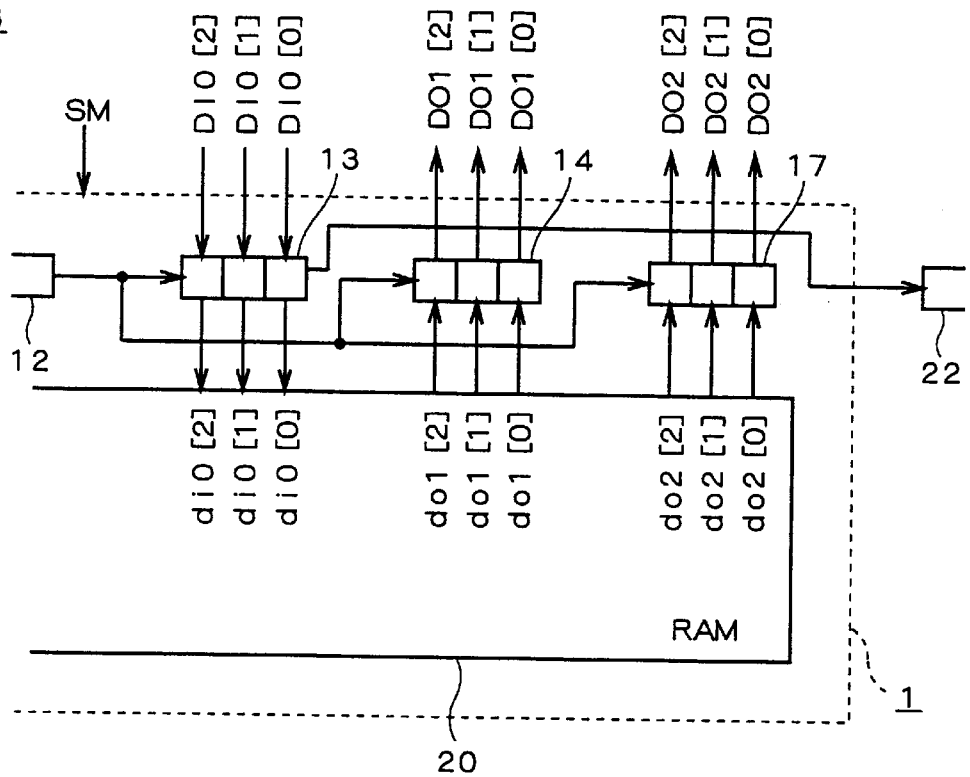
FIG. 7 is a block diagram showing a device according to a sixth preferred embodiment.

FIG. 7 is a block diagram showing the structure of a RAM and its vicinity in a semiconductor device according to a sixth preferred embodiment. In this device 106, the RAM 20 has 1-port data input portions di0[n] and 2-port data output portions do1[n] and do2[n]. That is to say, the device 106 has a RAM of 1-port write and 2-port read type (1W2R-RAM) as a storage unit.

The device 106 has a scan path 17, which is connected in parallel to the scan path 13, similarly to the scan path 14. Namely, the three scan paths 13, 14 and 17 have their input ends connected in common to the output end of the scan path 12 (FIG. 1) located at the stage preceding the scan path 13.

The scan path 13 supplies test pattern to the data input portions di0[n] of the RAM 20 and also captures the data signals DI0[n] from the combinational logic circuit 40. The scan path 14 supplies test pattern as the data signals DO1[n] to the combinational logic circuit 40 and captures the data signals from the data output portions do1[n] of the RAM 20. Similarly, the scan path 17 supplies test pattern as the data signals DO2[n] to the combinational logic circuit 40 and captures the data signals from the data output portions do2[n] of the RAM 20.

These operations are performed on the basis of the scan mode signal SM. Specifically, when the scan mode signal SM is 1, the scan path 13 gives test pattern to the data input portions dio[n] and the scan path 14 gives the same test pattern to the combinational logic circuit 40 as the data signals DO1[n]. Further, the scan path 17, similarly to the scan path 14, gives the same test pattern to the combinational logic circuit 40 as the data signals D02[n].

[0084] When the scan mode signal SM is 0, the scan path 13 captures the data signals DI0[N] from the combinational logic circuit 40 and the scan path 14 captures the data signals from the data output portions do1[n] of the RAM 20. Similarly to the scan path 14, the scan path 17 captures the data signals from the data output portions do2[n] of the RAM 20.

The data signals from the data output portions do1[n], do2[n] may include undefined value, but these data signals are not transferred to the MISR 51 (FIG. 10) through the scan path 22. Transferred to the MISR 51 are only the data signals DI[n] taken into the scan path 13. Hence it is possible to normally achieve BIST to the combinational logic circuits 40, 41, 42 (FIG. 13), i.e., logic BIST, without being affected by undefined value, and without initializing the RAM 20.

Figure 8:
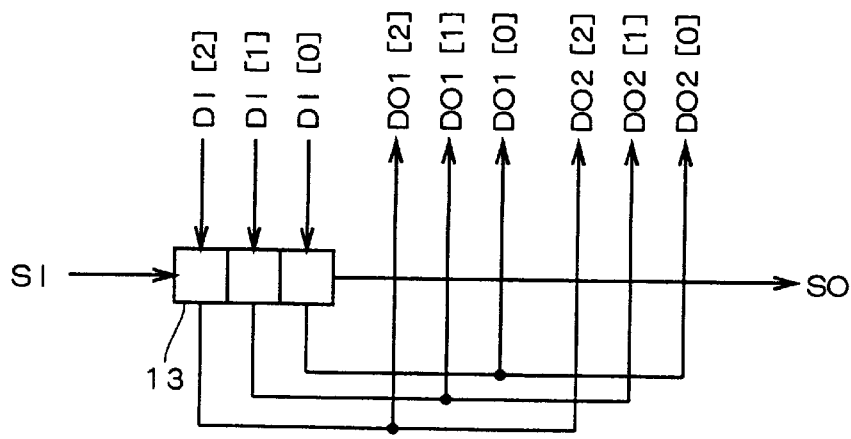
FIG. 8 is an equivalent block diagram showing the device of the sixth preferred embodiment.

Further, since the scan paths 13, 14 and 17 are not in a cascade relation but in a parallel relation and are connected in common to the scan path 12, the scan paths 13, 14 and 17 can be represented as shown in FIG. 8 equivalently. That is to say, the scan paths 13, 14 and 17 can be represented as equivalent to the single scan path 13 which is not branched. Thus using the circuit in FIG. 8 as an object of simulation or the like in place of the circuit of FIG. 7 enables the use of commercial CAD tools for design-for-testability.

As described above, the device 106 can remove the influence of undefined value stored in the RAM 20 and perform logic BIST in a short period. Further, similarly to the device 101, it causes no problem when using commercial CAD tools for design-for-testability.

<Seventh Preferred Embodiment>

Figure 9:
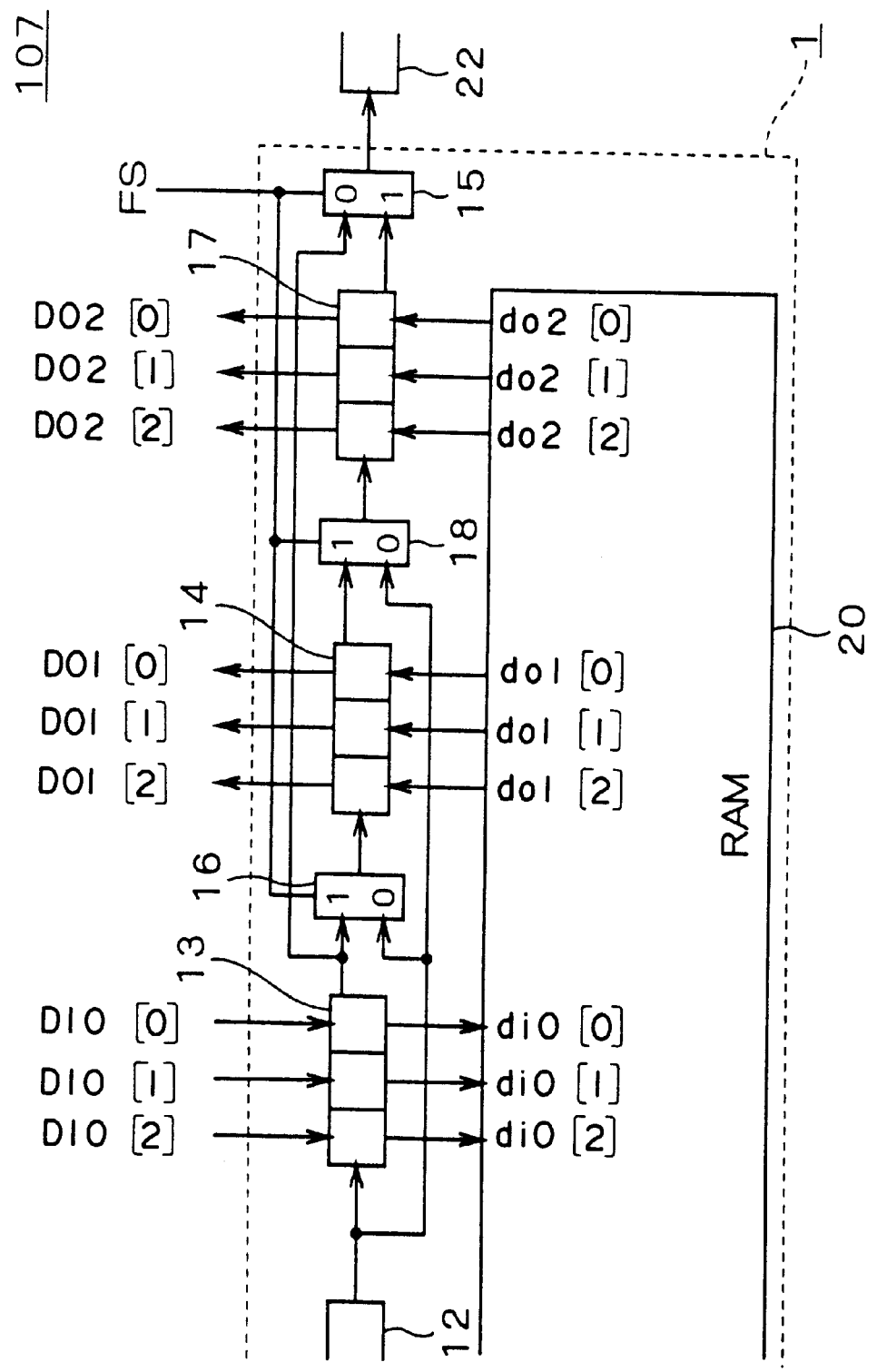
FIG. 9 is a block diagram showing a device according to a seventh preferred embodiment.

FIG. 9 is a block diagram showing the structure of the RAM and its vicinity in a semiconductor device according to a seventh preferred embodiment. In this device 107, the selector 15 is connected to the input end of the scan path 22 and the selector 15 has its two inputs respectively connected to the output ends of the scan paths 13 and 14. The selector 16 is connected to the input end of the scan path 14, and the selector 16 has its two inputs respectively connected to the output ends of the scan paths 12 and 13. Further, a selector 18 is connected to the input end of the scan path 17, and the selector 18 has its two inputs respectively connected to the output ends of the scan paths 12 and 14.

These selectors 15, 16 and 18 are supplied with the full scan signal FS in common from outside. When the full scan signal FS is 0, the selector 15 selects the output signal from the scan path 13 and transfers it to the scan path 22, and at the same time, the selector 16 selects the output signal from the scan path 12 and transfers it to the scan path 14. The selector 18 selects the output signal from the scan path 12 and transfers it to the scan path 17. In this situation, the device 107 is equivalent to the device 106, and the scan paths 13, 14 and 17 are equivalently represented in FIG. 8. Accordingly, it is possible to remove the influence of undefined value in the RAM 20 and execute logic BIST in a short period. Commercial CAD tools for design-for-testability can be used as well.

When the full scan signal FS is 1, the selector 15 selects the output signal from the scan path 17 and transfers it to the scan path 22. At the same time, the selector 16 selects the output signal from the scan path 13 and transfers it to the scan path 14. The selector 18 selects the output signal from the scan path 14 and transfers it to the scan path 17. That is to say, the scan paths 13, 14 and 17 are connected in cascade in this order to form a single row of scan path.

Accordingly, the data signals outputted from the data output portions do1[n], do2[n] of the RAM 20 can be captured into the scan paths 14 and 17 and transferred to the following scan path 22. This enables BIST or scan test to the RAM 20.

Further, while the scan paths themselves must be tested in advance when testing the RAM 20, the scan paths can be tested in a single test in the device 107, since the scan paths 13, 14 and 17 form a single row of scan path when FS=1.

As described above, the device 107 can remove the influence of undefined value stored in the RAM 20 and quickly execute logic BIST and also can test the RAM 20 by using the scan paths 13, 14 and 17. Similarly to the device 101, it raises no problem in the use of commercial CAD tools for design-for-testability. Further, it can efficiently test the scan paths themselves.

<Modifications>

(1) In the above-described preferred embodiments, the input ends of the scan paths 14, 17 are connected to the output end of the scan path 12 directly or through selectors. Hence the same test pattern is held in the scan paths 13, 14 and 17. However, generally, the input ends of the scan paths 14 and 17 may be connected to an output of an SFF 2 located at any stage previous to the output end of the scan path 13. For example, the input ends of the scan paths 14 and 17 may be connected to the output end of the scan path 11. This can be represented as follows:

Refer to a row of the scan paths 11, 12, and 13 including FFs for relaying signals transferred from the combinational logic circuit 40 to the RAM 10(, 20) as a first scan path, and refer to another row of the scan paths 14 to 17 including FFs for relaying storage data signals transferred from the RAM 10(, 20) to the combinational logic circuit 40 as a second scan path. Take the number of stages of the first scan path as m and the number of stages of the second scan path as n (n≦m). Then, we can generally express that the input end of the second scan path may be connected to an output of any of the first to (m−n)th stages of the first scan path, directly, or through a selector.

Also in this configuration, the first and second scan paths can be equivalent to a scan path without branch for the logic unit. Hence no problem is encountered when using a commercially available CAD tool for design-for-testability in logic simulation or the like.

(2) Although the sixth and seventh preferred embodiments have shown examples including a RAM of one-port write and two-port read type as a storage unit, it can generally be expanded to a device having a storage unit of one-port write and k (k≧2)-port read type. In this case, when the row of scan paths 11, 12 and 13 is referred to as a first scan path and scan paths connected to the k-port data output portions do1[n] to dok[n] are respectively referred to as second to (k+1)th scan paths, the device shown in FIG. 7 can be expanded to a device in which input ends of the second to (k+1)th scan paths are connected to an output of any of the first to (m−n)th stages of the first scan path.

The number m represents the number of stages of the first scan path, and the number n represents the number of stages of each one of the second to (k+1)th scan paths.

Further, the device of FIG. 9 can be expanded to a device in which k selectors (second to (k+1)th selectors) are respectively connected to the input ends of the second to (k+1)th scan paths. When the full scan signal FS is 0, the second to (k+1)th selectors connect the second to (k+1)th scan paths in parallel so that it becomes equivalent to the expansion of the example of FIG. 7. When the full scan signal FS is 1, the second to (k+1)th selectors connect in cascade the first scan path and the second to (k+1)th scan paths in this order to form a row of scan path.

While the invention has been described in detail, the foregoing description is in all aspects illustrative and not restrictive. It is understood that numerous other modifications and variations can be devised without departing from the scope of the invention.

We claim:

1. A semiconductor device comprising:
   a storage unit;
   a logic unit which exchanges data signals with said storage unit;
   a first scan path with m (≧1) stage(s) for transferring a data signal from said logic unit to said storage unit;
   a second scan path with n (≦m) stage(s) for transferring a storage data signal from said storage unit to said logic unit;
   a test pattern generating circuit for generating a test pattern and supplying the test pattern to an input end of said first scan path;
   an output data compacting circuit for outputting a signature which is a signal representing an input signal in a compacted form; and
   a transfer path for transferring a signal from an output end of said first scan path to said output data compacting circuit without through said second scan path;
   wherein said second scan path has an input end connected to an output of one of the first to (m−n)th stage(s) of said first scan path.

2. The semiconductor device according to claim 1, further comprising a first selector interposed in said transfer path, responsive to a control signal inputted from outside, for selecting one of the signal from the output end of said first scan path and a signal from an output end of said second scan path and transferring a selected signal to said output data compacting circuit.

3. The semiconductor device according to claim 2, further comprising a second selector interposed between said input end of said second scan path and said output of said one of the first to (m−n)th stage(s) of said first scan path,
   wherein said second selector is responsive to said control signal to select one of a signal from said output of said one of the first to (n−m)th stage(s) and the signal from said output end of said first scan path and output a selected signal to said input end of said second scan path,
   and wherein when said first selector selects the signal from the output end of said second scan path, said second selector selects the signal from the output end of said first scan path.

4. The semiconductor device according to claim 3, further comprising
   a signal generating circuit for generating a signal for initializing or testing storage data in said storage unit, and
   a selecting element responsive to an instruction from said signal generating circuit, for supplying said signal generated by said signal generating circuit to said first scan path in such a manner that said test pattern and said signal generated by said signal generating circuit can be freely switched.

5. The semiconductor device according to claim 3, further comprising
   a selecting element responsive to said control signal, for selecting one of said test pattern generated by said test pattern generating circuit and a test pattern supplied from outside and supplying a selected test pattern to said input end of said first scan path, and
   a pin capable of taking outside a signal inputted to said output data compacting circuit,
   wherein when said first selector selects the signal from the output end of said second scan path, said selecting element selects said test pattern supplied from outside.

6. The semiconductor device according to claim 2, further comprising
   a signal generating circuit for generating a signal for initializing or testing storage data in said storage unit, and
   a selecting element responsive to an instruction from said signal generating circuit, for supplying said signal generated by said signal generating circuit to said first scan path in such a manner that said test pattern and said signal generated by said signal generating circuit can be freely switched.

7. The semiconductor device according to claim 2, further comprising
   a selecting element responsive to said control signal, for selecting one of said test pattern generated by said test pattern generating circuit and a test pattern supplied from outside and supplying a selected test pattern to said input end of said first scan path, and a pin capable of taking outside a signal inputted to said output data compacting circuit, wherein when said first selector selects the signal from the output end of said second scan path, said selecting element selects said test pattern supplied from outside.

8. The semiconductor device according to claim 1, further comprising third to Kth (K≧3) scan path(s), wherein said second to Kth scan paths each have n stage(s) comprising n storage element(s) for relaying the storage data signal with n bit(s) transferred from said storage unit to said logic unit, and said second to Kth scan paths have their respective input ends connected in common to said output of said one of the first to (m—n)th stage(s) of said first scan path.

9. The semiconductor device according to claim 8, further comprising a first selector responsive to a control signal inputted from outside, for selecting one of the signal from the output end of said first scan path and a signal from an output end of said Kth scan path and transferring a selected signal to said output data compacting circuit, and second to Kth selectors respectively interposed between input ends of said second to Kth scan paths and said output of said one of the first to (m−n)th stage(s) of said first scan path, wherein said second selector is responsive to said control signal to select one of a signal from said output of said one of the first to (m−n)th stage(s) and the signal from said output end of said first scan path and output a selected signal to said input end of said second scan path, for all of j(s) in the range of 3≦j≦K, said jth selector is responsive to said control signal to select one of the signal from said output of said one of the first to (m−n)th stage(s) and a signal from an output end of said (j−1)th scan path and output a selected signal to said input end of said jth scan path, and wherein when said first selector selects the signal from the output end of said Kth scan path, said second selector selects the signal from the output end of said first scan path and said jth selector selects the signal from the output end of said (j−1)th scan path.

10. The semiconductor device according to claim 1, wherein said one of the first to (m−n)th stage(s) is (m−n)th stage.

* * * * *